United States Patent [19]
Okazaki et al.

[11] Patent Number: 5,127,330
[45] Date of Patent: Jul. 7, 1992

[54] METHOD INCLUDING TREATMENT OF INK ON A PLATE TO CAUSE HARDENING AT OTHER THAN THE INK OUTER SURFACE BEFORE PRINTING

[75] Inventors: Satoshi Okazaki; Hiroyuki Matsui; Satoshi Takeuchi, all of Tokyo, Japan

[73] Assignee: Dai Nippon Insatsu Kabushiki Kaisha, Japan

[21] Appl. No.: 539,333

[22] Filed: Jun. 18, 1990

[30] Foreign Application Priority Data
Jun. 16, 1989 [JP] Japan ............... 1-153841
Jun. 16, 1989 [JP] Japan ............... 1-153842

[51] Int. Cl.⁵ ............... B41M 1/06; B41M 1/10
[52] U.S. Cl. ............... 101/450.1; 101/170; 101/491
[58] Field of Search ............... 101/450.1, 451, 452, 101/170, 483, 492, 491

[56] References Cited

U.S. PATENT DOCUMENTS

| | | | |
|---|---|---|---|
| 1,410,824 | 3/1922 | Mascord | 101/170 X |
| 2,119,190 | 5/1938 | Wienke | 101/450.1 |
| 2,303,395 | 12/1942 | Schultz et al. | 101/170 X |
| 2,711,132 | 6/1955 | Viscardi | 101/170 |
| 3,255,695 | 6/1966 | Johnson et al. | 101/170 X |
| 3,671,237 | 6/1972 | Haas et al. | 101/467 X |
| 3,688,695 | 9/1972 | James | 101/491 X |
| 4,341,156 | 7/1982 | Kaeppner | 101/451 X |
| 4,836,102 | 6/1989 | Cicci | 101/450.1 X |

FOREIGN PATENT DOCUMENTS 0011083 1/1982 Japan ............... 101/450.1

*Primary Examiner*—Clifford D. Crowder
*Attorney, Agent, or Firm*—Parkhurst, Wendel & Rossi

[57] ABSTRACT

For printing fine patterns, a fine pattern of a setting type ink is applied to a printing plate surface to become printing elements. Then, the setting type ink thus applied on the printing plate is subjected to a setting treatment thereby to set at least one part of the ink pattern, and thereafter the printing plate and an object to be printed are pressed relatively against each other thereby to transfer the ink pattern onto the print object. The printing plate can be an intaglio plate or a lithographic plate. Fine patterns of printing element widths as fine as 3 μm with an ink film thickness of 2 μm can be printed efficiently with the high precision on various objects including hard and rigid objects.

19 Claims, 5 Drawing Sheets

FIG. IA 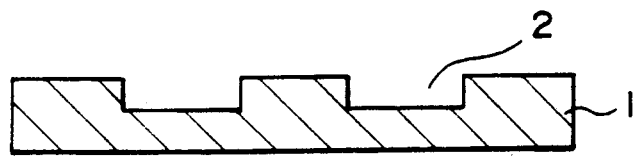
FIG. IB 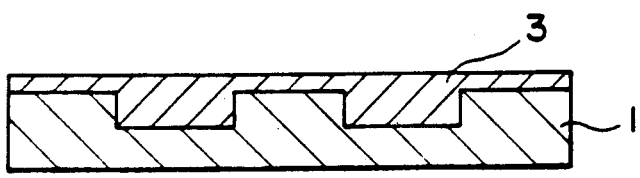
FIG. IC-1 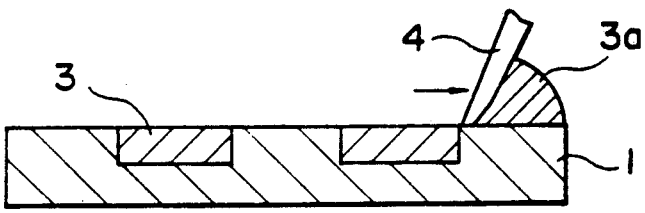
FIG. IC-2 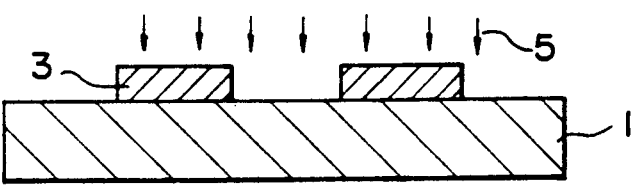
FIG. ID 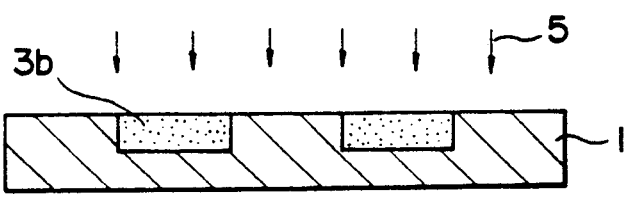
FIG. IE 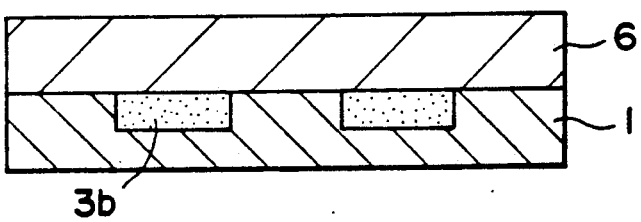
FIG. IF 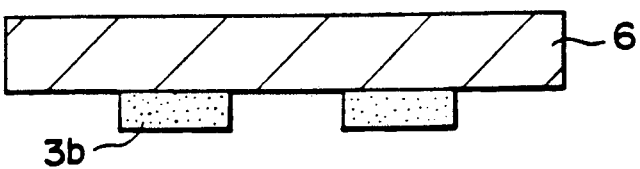

METHOD INCLUDING TREATMENT OF INK ON A PLATE TO CAUSE HARDENING AT OTHER THAN THE INK OUTER SURFACE BEFORE PRINTING

BACKGROUND OF THE INVENTION

This invention relates to a method of printing fine patterns by which fine patterns are formed by printing processes. More specifically, the invention relates to a printing method suitable for forming, with high precision and moreover on a quantity-production scale, fine resist patterns of, for example, patterns of fine electrical circuits and elements to be supplied for electronic components.

In recent years, great progress has been made in the formation of printed electrical wiring and circuit patterns on glass and ceramic plates. Advancement has also been made in the formation of resist patterns for etching of metal plates. In these methods of forming patterns, printing techniques such as screen printing and offset printing are widely adopted. These printing processes having been suitable for forming patterns of relatively wide (200 μm or more) printing elements (lines). However they have not been suited to the formation of fine patterns of printing areas of less width. Moreover, these prior techniques have been accompanied by problems such as deformation of printed patterns due to causes such as the effect of the fluidity of the ink and the pressure of the printing plate and remnant ink on the printing plate and not being transferred onto the object being printed. As a consequence, the reproducibility of the printed pattern has been poor.

For example, by the screen printing process, printing is carried out by forming on a mesh-form screen an ink-shielding mask so that the non-masked parts of this mask form a desired pattern and causing ink to pass through the non-masked parts and adhere to the object being printed (hereinafter referred to as print object). By this printing method, thick ink impression (thickness of a number of μm to 20 μm) can be readily achieved. For this reason, printing of an excellent resist pattern having erosion resistance is possible. However, since the width of printing elements (lines) for practical use is limited to a minimum of the order of 200 μm, it has been difficult to accomplish printing of complicated fine patterns by this method.

The offset printing process typically comprises forming lipophilic parts and hydrophilic parts on a presensitized (PS) plate, causing moisture to be retained in the hydrophilic parts thereby to cause repelling of the lipophilic ink, and printing the resulting ink pattern on a print object. In the practice of the offset printing process, particularly in order to improve the printability, the ink pattern on the PS plate is first transferred onto a rubber blanket and thereafter retransferred onto the print object such as paper.

By this printing method, relatively fine printed elements can be readily obtained. However, for reasons such as the inking method and the two transferring steps, the printed ink film thickness tends to become thin, of the order of 1 to 2 μm. This gives rise to the problem of the occurrence of pinholes and broken printing elements. Furthermore, various attempts are being made to increase the coating film thickness of the ink and to devise processes capable of forming fine patterns of excellent erosion resistance in the practice of this printing method. However, if the ink film thickness is made thick, the printed elements will become wide. Consequently, printing by this method has been limited to a minimum printed element width of the order of 100 to 200 μm.

This is the limit by the above described printing method when fine-line printing is attempted thereby. If printing of a pattern of even finer line widths is attempted, the ink film thickness will simultaneously become thinner. For this reason, it has not been possible to apply this printing method to the forming of particularly fine patterns requiring erosion resistance such as resist patterns.

Thus, by a printing method, it has been difficult to form fine patterns. Moreover, the printed pattern could not necessarily be made true to the printing plate pattern, whereby printing has been inadequate on the point of reproducibility. Accordingly, particularly for forming of fine patterns, it has been unavoidably necessary, in general, to resort to photolithography. Formation of very fine patterns is possible by photolithography. In comparison with printing processes, however, photolithographic processes have been accompanied by the problems of complicated process steps, low productivity, and high cost.

As a mode of printing by which patterns of relatively narrow printing elements (lines) can be printed to produce printed films of large thickness, there is the intaglio printing method. This printing method comprises forming recessed parts conforming to printing elements by engraving or etching on a printing plate such as a copper plate, rubbing somewhat hard ink into these recessed parts, wiping off the ink on the non-printing areas, thereafter laying a print paper on the copper plate, and pressing the paper with considerable force against the plate. The reason for thus applying considerable force on the paper is as follows. Since the ink which has been rubbed into the recessed parts is in a state wherein it is somewhat recessed from the surface of the printing plate, a great pressing force is applied on a soft print object such as paper thereby to force the ink surface into positive contact with and adhesion to the surface of the print object. The ink is thereby transferred accurately and positively onto the print object.

The conventional intaglio printing method is more suitable for printing fine printing elements than the aforedescribed screen printing method or offset printing method. In spite of this, however, the intaglio printing method has a great problem in that printing by this method on the surfaces of hard base materials such as rigid plastics, glass, ceramics, and metal is almost impossible.

SUMMARY OF THE INVENTION

The present invention has been made in view of the above described problems. It is an object of the invention to provide a method of printing fine patterns by which fine patterns of printing element (line) widths which are much finer than those by conventional printing methods with amply suitable ink thickness can be formed by printing, and by which, moreover, these fine patterns can be formed accurately, positively, and sharply and, furthermore, efficiently and at low cost on any of various materials including hard-surface and rigid materials.

The above object and other objects have been achieved by this invention which comprises applying a fine pattern of a setting type ink to become printing elements (image lines) on the printing surface of a printing plate, subjecting the setting type ink thus applied on the printing plate to a hardening or setting treatment thereby to set the pattern of the ink at least at a part thereof other than a surface layer part, and pressing the printing plate against a print object thereby to transfer the ink pattern onto the print object.

The present invention affords the following advantageous features in the forming of fine patterns. By the method of the invention, patterning of fine patterns of setting type ink of very fine printing elements and ample film thickness can be carried out by using an intaglio printing plate or a lithographic printing plate. The hardening or setting type ink thus patterned is amply set. That is, the ink is rendered non-fluid and at the same time, the pattern thus formed on the printing plate is maintained as it is. Then, the set ink is transferred onto the print object. As a result, the set ink layer comprising the fine pattern, exactly as formed on the printing plate, can be reproduced by printing on the print object without distortion or deformation.

The nature, utility, and further features of this invention will be more clearly apparent from the following detailed description with respect to preferred embodiments of the invention when read in conjunction with the accompanying drawings.

BRIEF DESCRIPTION OF THE DRAWINGS

FIGS. 1A through 1F are descriptive sectional views indicating the sequential steps of the printing process according to a first embodiment of this invention;

DESCRIPTION OF THE PREFERRED EMBODIMENTS

Figure 2:
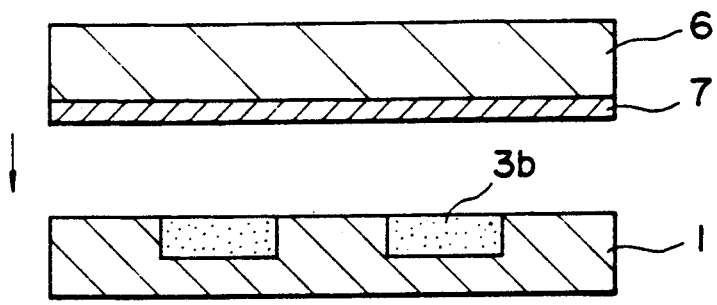
FIGS. 2 through 5 are similar sectional views indicating the steps of different modes of the printing process of the invention.

Referring first to FIG. 1A, an example of a printing plate 1 suitable for use in the practice of this invention is shown therein. For this plate 1, an intaglio printing plate as shown or a lithographic printing plate as described hereinafter is used. The plate 1 is not limited in form to a flat-plate shape as illustrated but may be a cylindrical printing plate constructed, for example, into a cylindrical form by wrapping a plate around a structure such as a rubber roller, as will be described later.

In the case where the plate 1 is an intaglio printing plate (sometimes referred to as a copper plate), recessed parts 2 to become pattern printing areas are formed in its printing face. In the case where the plate 1 is a lithographic printing plate, pattern parts corresponding to the above mentioned recessed parts 2 are formed on the printing face of this lithographic printing face. The method of forming these recessed parts 2 is not particularly limited. For example, a metal plate material (in general, copper, copper alloy, iron, iron alloy, or some other metal) whose printing face has been polished to a smooth surface can be engraved by an electronic photoengraving method. Another possible method comprises providing a resist mask by an optical process on the plate material and then forming the printing pattern by etching. The recessed parts 2 can be made in an extremely fine form of a line width of the orders of 5 to 50 $\mu$m and a depth (plate depth) of the order of 1 to 10 $\mu$m.

Furthermore, the plate material is not limited to metals. Other hard materials such as glass and ceramics may be used. In addition, in order to increase the hardness of the printing surface of an intaglio printing plate 1, the printing surface may be plated with a hard metal such as nickel or chromium. By this process, the durability of the printing surface with respective to the action of a doctor blade in scraping off surplus ink can be improved. In forming the pattern parts of a lithographic printing plate, a known plate making method adopted for lithographic printing can be applied.

Then, as shown in FIG. 1B, the printing surface of the printing plate (intaglio printing plate) 1 is coated with a hardening or setting type ink 3. The application of this ink 3 as a coating can be readily accomplished by a process such as immersing the plate in a vessel containing the ink or pouring the ink so that it flows over the printing surface of the plate.

A setting ink 3 suitable for use in the practice of this invention is of a setting character such as a thermosetting type or a type set or solidified by ionizing radiation. An ink of a solventless type and, moreover, has a relatively low viscosity is desirable. Specific examples of suitable inks are those of the type set by ultraviolet radiation, of the type set by electron-ray radiation, and of the type set by infrared (or thermal) radiation which are generally available on the market. An extremely advantageous feature of the present invention is that, in the practice thereof, a conventional ink as described above can be utilized.

The basic composition of the ink 3 is as described below with respect to an ink of the type set by ultraviolet ray radiation, as an example. Without the use of a solvent, the essential ingredients are a photosensitive prepolymer or monomer and a photopolymerization initiator used as binders, a pigment as a coloring material, a suitable sensitizer, a tackiness adjuster, and other ink auxiliary agents as necessary. Instead of an ordinary ink of the type set by ultraviolet ray radiation, a material appropriately selected from photoresist materials used for applications such as fabrication and photoetching of semiconductors may be used. Furthermore, for the ink for a lithographic plate, it is not necessary to use an ink of high viscosity as in the conventional lithographic printing. An ink of somewhat low viscosity can be used. Adjustment of the viscosity of this ink can be carried out by selectively using a low-viscosity prepolymer or monomer from among those containing photopolymerization initiators that are binders.

After the plate 1 has been coated with the ink 3, in the case where the plate 1 is an intaglio printing plate, surplus ink 3a on the printing surface of the plate is scraped off with a doctor blade 4 made of a material such as a thin metal plate as indicated in FIG. 1C-1. In this manner, the ink 3 is caused to be retained and fill only the recesses 2 to become the printing elements of the plate 1.

On the other hand, in the case where the plate 1 is a lithographic printing plate, the setting type ink 3 applied on the plate 1 adheres naturally on only the printing pattern parts as a result of the mutual effect of surface energy between the plate and the ink, as indicated in FIG. 1C-2. In the case of either plate, patterning of the ink 3 is carried out at this stage.

Then, as indicated in FIG. 1D, a solidifying or setting treatment by heat or irradiation with radiation rays 5 is applied to the ink 3 in the recessed parts 2. The ink is thereby caused to undergo a reactive activation. Thus, within the recessed parts 2, a reaction causing an increase in viscosity or setting occurs. As a result, the fluidity of the ink is reduced thereby to render it into a set (solid) ink 3b. In the case of a lithographic plate also, similarly as with an intaglio plate, a reaction for increasing the viscosity or setting of the ink is caused on the plate by heating or irradiation with radiation rays 5 as indicated in FIG. 1C-2. Thus the patterned ink 3 becomes a set ink 3b. A suitable degree of setting of the ink by this process is a total of 90% or higher when expressed as the percentage of gelated ink.

After the ink has set, the print object 6 is superimposed against the plate 1, and the two are pressed together into intimate contact as shown in FIG. 1E. Then, by separating the two members, the set ink 3b in the recessed parts 2 of the plate 1 is transferred onto the print object 6 as indicated in FIG. 1F. Thus the printing according to the printing process of this invention is accomplished. In the case of a lithographic plate also, the set ink on the plate is similarly transferred onto the object being printed. The print object 6 in this case is preferably a material having pliability such as a paper or a thin film.

Figure 3:
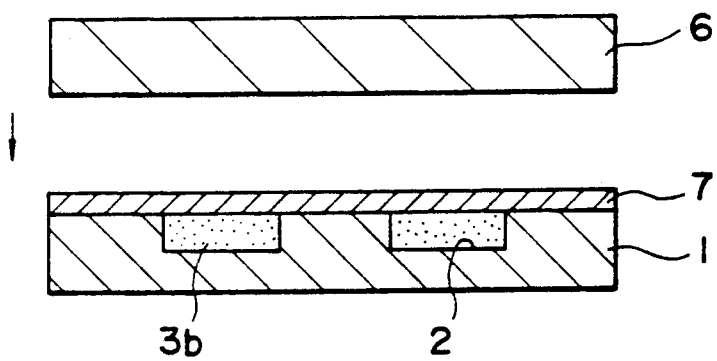

In the practice of the printing process of this invention with respect to a print object 6 possessing rigidity such as a metal, a ceramic, a glass, or a plastic, a coating layer 7 of an adhesive or a tacky substance is formed on the side of the print object 6 or on the side of the (intaglio) plate 1 as indicated in FIGS. 2 and 3. Then, with the members in a state wherein the layer 7 is interposed between the printing plate 1 and the print object 6, the set ink 3b is transferred onto the object 6 as indicated in FIG. 4.

By this technique, the problem of unreliability and instability of the transfer of the set ink 3b onto the print object can be effectively overcome. This problem would otherwise arise from a number of causes such as the difficulty of bringing about direct contact between the surface of the print object 6 and that of the set ink 3b. Another possible cause of this problem of transfer instability is the difficulty of causing the ink, because of its dried state, to adhere to the object being printed even when the ink is placed in good contact with the object. Thus the method of this invention makes possible stable and positively reliable printing also on any print object which has rigidity.

In the case where the adhesive or tacky layer 7 is provided on the side of the printing plate 1 as indicated in FIG. 3, the setting type ink 3 is first patterned in the recessed parts 2 (or the pattern plate parts), or the patterned setting type ink is set. Then the adhesive or tacky layer 7 is formed over the entire printing surface of the printing plate. The adhesive or tacky material for forming this layer 7 is selected from those sold on the market that can be readily applied as coating and moreover have weak adhesiveness or tackiness relative to the printing surface of the printing plate 1. For example, this material can be appropriately selected from various types depending on the type of the intended adhesion or tacking process step such as a solvent-activated type, a heat-activated type, a pressure-activated type, or a chemical reaction type. Among these, pressure-sensitive adhesives (tacky materials) of the pressure-activated type and hot-melt type adhesives of the heat-activated type are preferred.

Figure 4:
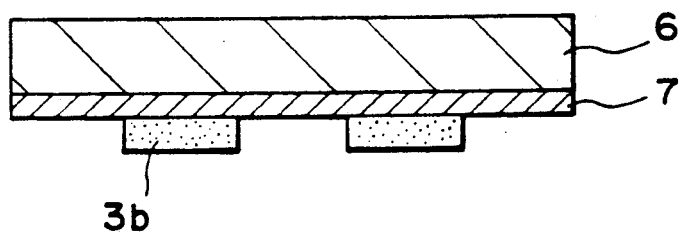
Figure 5:
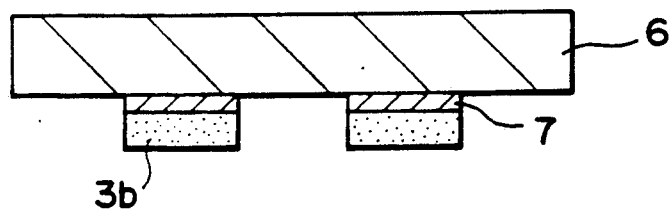

In the practice of this invention, in the case of printing by way of the adhesive or tacky layer 7, this layer 7 exists also in the non-printing areas in which, on the surface of the print object 6, a transferred layer of set ink 3b does not exist, as indicated in FIG. 4. However, depending on the necessity, this layer 7 over the non-printing areas is removed by a suitable method as indicated in FIG. 5. In the case where the ink layer 3b is for etching resist printing, the layer 7 can be removed by an etching method such as a dry etching method utilizing plasma or a wet etching method using a suitable etching liquid. Examples of other possible removal methods are those of ozone oxidation, decomposition by radiation energy, and dissolving with a solvent or a chemical.

Figure 6A:
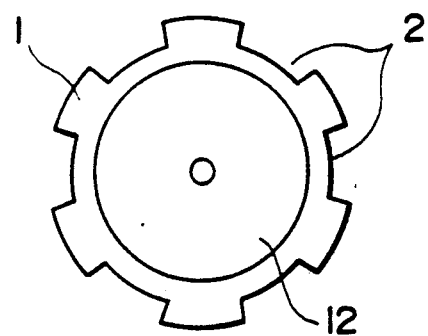
FIGS. 6A through 6D are descriptive sectional side views indicating the sequential steps of the printing process constituting another embodiment of the invention, in which a plate cylinder roller is used.
Figure 6B:
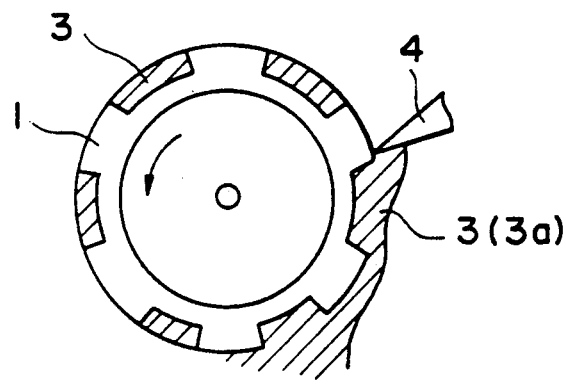

While, in the above described embodiment of the invention, the printing plate 1 is of planar form, the present invention can be practiced also with a printing plate 1 of cylindrical form as in another embodiment of the invention illustrated in FIGS. 6A through 6D. In this case, the cylindrical plate 1 is disposed around a core support such as, for example, a rubber roller 12 as shown in FIG. 6A. The process steps indicated in FIGS. 6A and 6B correspond to those indicated in FIGS. 1A, 1B, and 1C-1. Corresponding parts are designated by the same reference numerals.

Figure 6C:
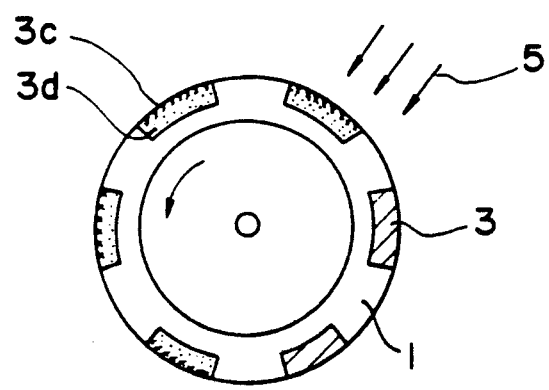
Figure 6D:
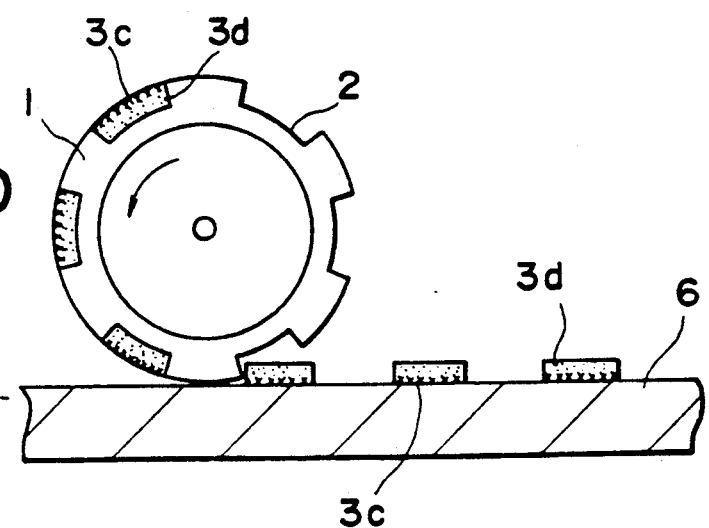

In this embodiment of the invention, the ink 3 which has been patterned in the recessed parts 2 or pattern part of the printing plate 1 is subjected to a setting treatment by heating or irradiation with radiation rays 5 as indicated in FIG. 6C. This treatment is so carried out that at least one part of the surface layer of the ink 3 assumes an incompletely set state. By this procedure, the setting type ink 3 becomes a patterned ink comprising an incompletely set surface layer part 3c and a completely set part 3d as indicated in FIGS. 6C and 6D. By this setting treatment, the ink 3 is reaction activated, and, in the recessed parts 2 of an intaglio printing plate (or the printing parts of a lithographic plate), an increase in viscosity of the ink or a setting reaction occurs. Thus the fluidity of the ink is reduced. However, the degree of setting in the incompletely set surface layer part 3c is less than that in the completely set part 3d. For this reason, properties such as tackiness are retained in the surface layer part 3c.

The method of rendering a part of the ink surface layer part into an incompletely hardened state is not particularly limited, it being possible to utilize any suitable method. For example, the setting characteristic of a setting type ink can be utilized, or the setting rate can be adjusted by using agents such as a setting suppressor. Still another method is to adjust the treatment direction or degree of the setting treatment.

In this embodiment, use is made of a setting type ink which has as its predominant ingredient a resin material having an acryl radical or a methacryl radical and is caused to set by vinyl polymerization. A characteristic of an ink of this kind is that the polymerization reaction of parts thereof in contact with the atmospheric air in the polymerization process is obstructed by the effect of the oxygen in the air. By utilizing this characteristic, the forming of the ink surface layer part 3c in an incompletely set state is facilitated. For example, in the case where a setting treatment 5 is applied as shown in FIG. 6C, the parts of the ink that are in the inner parts of the recessed parts 2 and are not in contact with the atmospheric air undergo complete setting to become a completely set part 3d. On the other hand, in the ink parts in contact with the atmospheric air, the polymerization reaction is obstructed, and setting is delayed. Consequently, the ink in these parts becomes an incompletely set surface layer part 3c.

After the ink has been irregularly set in this manner, the printing plate 1 and the print object 6 are superimposed, caused to be mutually in intimate contact, and then separated as indicated in FIG. 6D. The portions of the set ink 3c and 3d within the recessed parts 2 of the printing plate 1 are thereby transferred onto the print object 6. Thus the print object 6 is printed. During this operation, the transfer of the set ink onto the print object 6 is made positive and reliable by the tackiness residually retained in the incompletely set surface layer part 3c of the ink. In the case of a lithographic printing plate also, the part of the ink contacting the atmospheric air on the plate surface becomes an incompletely set surface layer part. As a result, the transfer of the set ink onto the print object is also made positive and reliable by the tackiness of this surface layer part. Thus the transfer of the ink is accomplished.

Figure 7A:
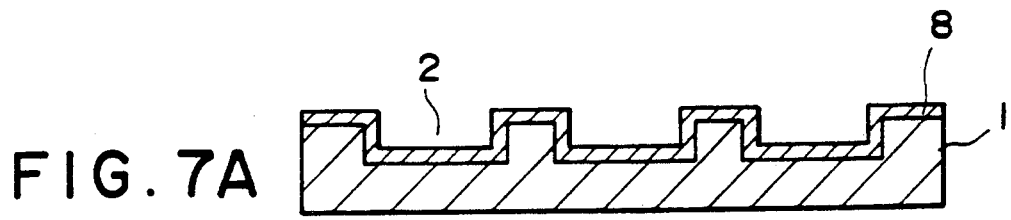
FIGS. 7A through 7E, FIGS. 8A, 8B, and 8C, and FIG. 9 are similar sectional views indicating the printing processes of respectively other different embodiments of the invention.
Figure 7B:
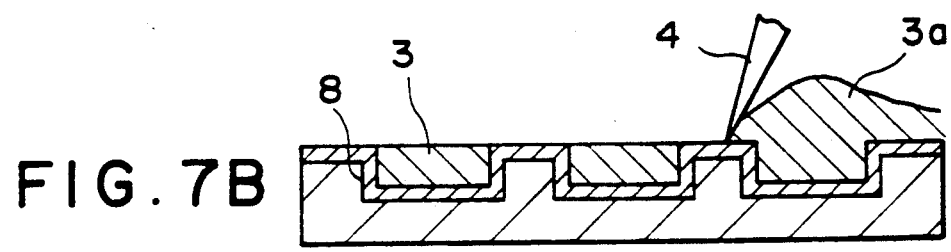
Figure 7C:
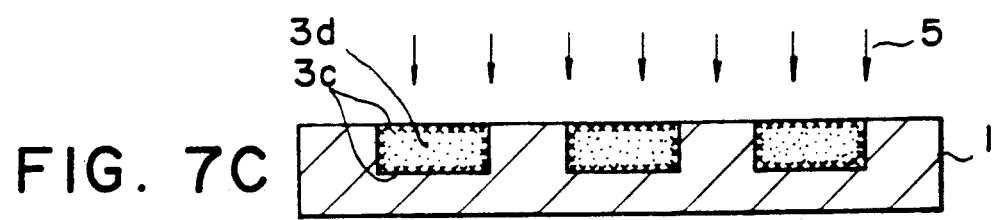

Another mode of practice of this invention is indicated in FIGS. 7A through 7E. As shown in FIG. 7A, a vinyl polymerization inhibitor 8 is applied as a coating beforehand on the surface of a printing plate 1. Thereafter, as indicated in FIG. 7B, a setting type ink 3 is applied as a coating over the vinyl polymerization inhibitor 8 and patterned by removing surplus ink 3a. Then, as indicated in FIG. 7C, a setting treatment 5 may be carried out. As a result, the setting type ink 3 assumes an incompletely set state at its parts contacted by the atmospheric air. At the same time, the ink parts in contact with the polymerization inhibitor 8 also are delayed in undergoing polymerization setting by the action of this inhibitor 8 and assume an incompletely set state. The resulting effect is that the peripheries around the ink in entirety become incompletely set surface layer parts 3c. Thus irregular setting takes place. For the vinyl polymerization inhibitor, any of known conventional inhibitors can be used. Among these, benzoquinone, butyl-catechol, and the like are preferred.

Figure 7D:
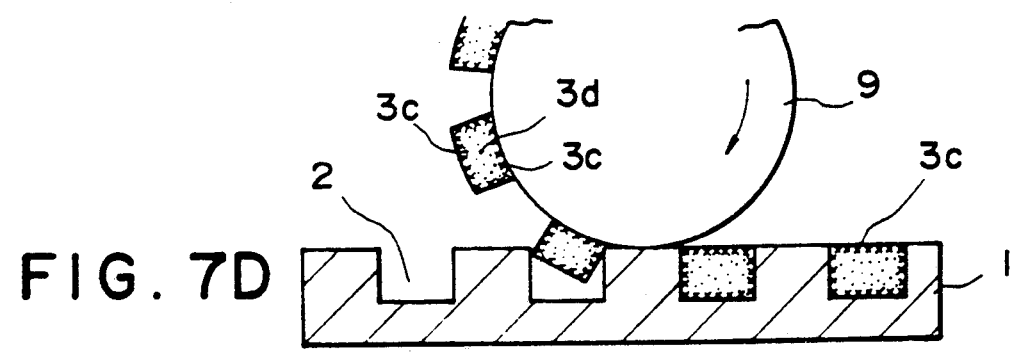
Figure 7E:
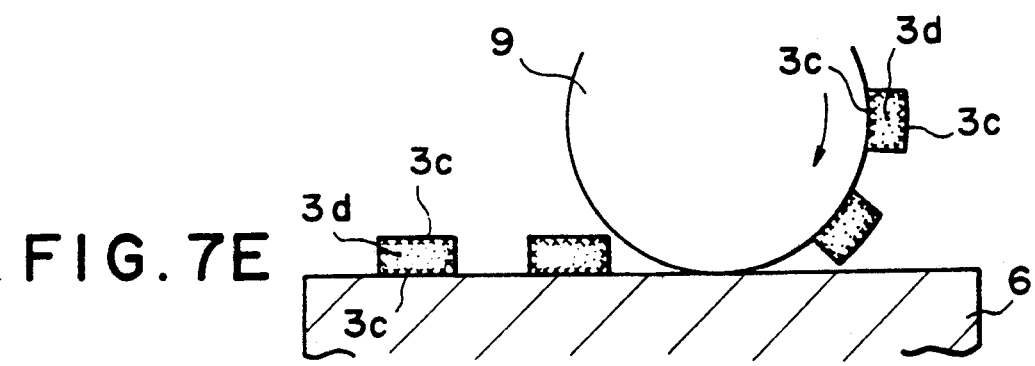

Still another mode of transferring ink which has been subjected to setting treatment onto a print object 6 is illustrated in FIGS. 7D and 7E. Portions of set ink 3c, 3d are once transferred onto an intermediate structure 9 such as a blanket cylinder. Thereafter, these ink portions 3c, 3d are retransferred onto the print object 6, which is thereby printed.

In the case of the transfer mode illustrated in FIG. 7D, the set ink is positively transferred onto the blanket 9 by the tackiness of the incompletely set surface layer part 3c on the side of the ink in contact with the atmospheric air above the printing plate 1. Furthermore, as a result of the tackiness of the incompletely set surface layer part 3c on the side of the ink contacting the polymerization inhibitor 8, the transfer of the set ink from the blanket 9 to the print object 6 as shown in FIG. 7E is positively accomplished.

Figure 8A:
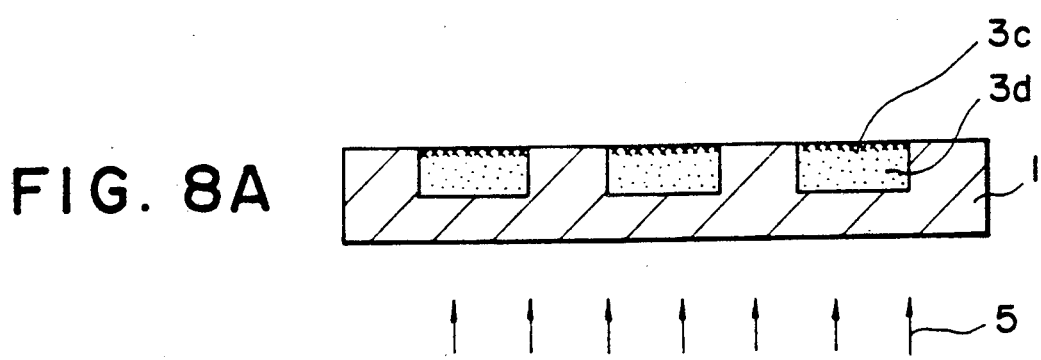
Figure 8B:
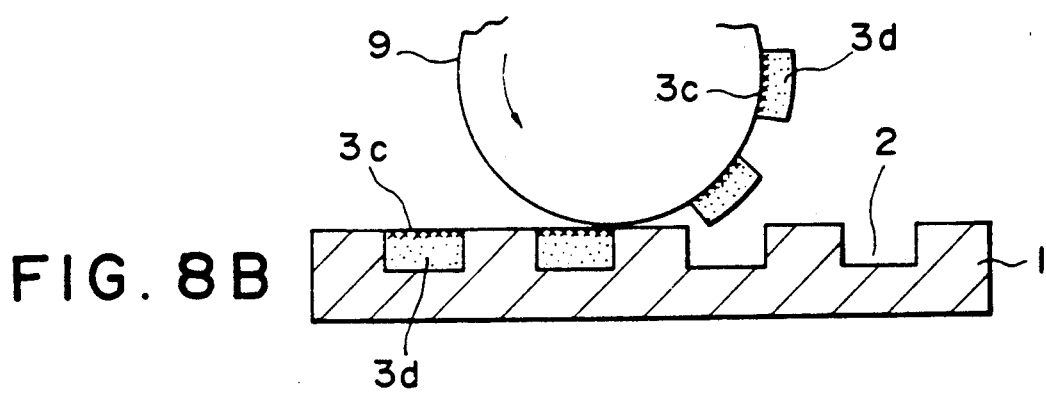
Figure 8C:
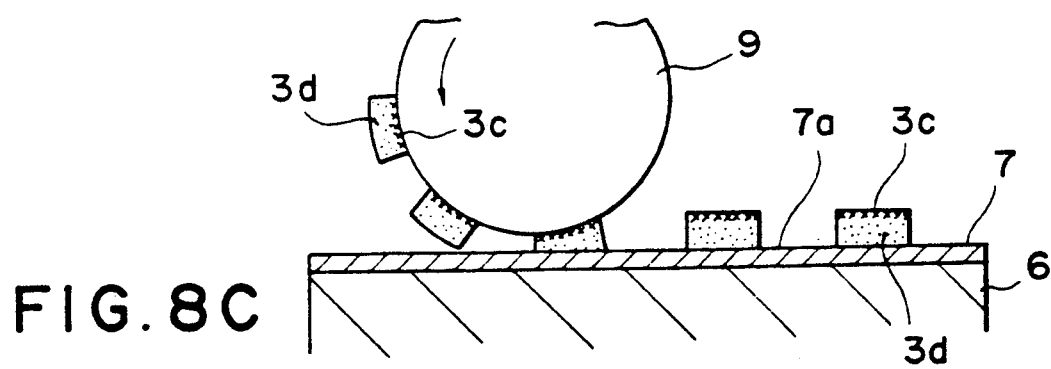

In the case where the set ink is transferred by way of an intermediate structure such as a blanket onto a print object 6, the transfer of the set ink onto the print object 6 can be made even more positive by interposing an adhesive or tacky layer 7 between the set ink and the print object 6 as indicated in FIG. 8C and then carrying out the transfer of the set ink. For this purpose, the adhesive or tacky layer 7 is ordinarily formed beforehand on the side of the object 6.

Figure 9:
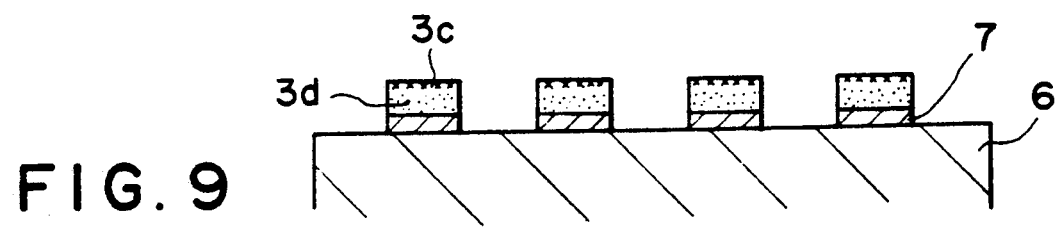

In the case of printing by way of the adhesive or tacky layer 7, a layer 7a exists also at non-printing areas wherein transferred portions of set ink layers 3c and 3d do not exist as shown in FIG. 8C. Depending on the necessity, this layer 7a at such non-printing areas is removed by an appropriate method to obtain the state shown in FIG. 9. By carrying out this removal processing, the surface of the print object 6 corresponding to the non-printing areas can be exposed. In the case where the ink layer 3c, 3d is for etching resist printing, this removal method can be any suitable method such as a dry etching method such as that utilizing a plasma or a wet etching method in which a suitable etching solution is used. Examples of other suitable removal methods are those utilizing ozone oxidation, radiation energy decomposition, and solvents or chemicals used for dissolving the layer 7a.

Furthermore, the radiative projection of ultraviolet rays or visible light rays 5 for the ink setting process can be carried out from the back surface side of the printing plate 1 as indicated in FIG. 8A. In this case it is necessary that the printing plate 1 be fabricated from a plate material through which ultraviolet rays or visible light can be transmitted. This mode of ink setting treatment affords advantages such as the possibility of varying the degree of setting at the inner or deeper parts and the surface layer parts of the ink, depending on the light transmittance of the ink.

The print object 6 can be made of any of various materials similarly as in the case of the first embodiment of the invention described hereinabove. Examples of suitable materials are papers and thin films and the like having pliability and rigid materials such as metals, ceramics, glasses, and plastics.

Particularly in the case of this embodiment of the invention, the ink 3 is set partially in a localized manner so as to form incompletely set surface layer parts 3c. The tackiness of these surface layer parts 3c is utilized to accomplish positive and efficient transfer of the set ink onto the object being printed. For this reason, printing can be readily carried out with respect also to an object possessing rigidity.

In this connection, in order to complete even more certainly the setting of the set ink layer which has been transferred, an additional setting treatment may be carried out according to necessity.

The printing method of this invention described above can be utilized widely for uses requiring formation of fine patterns. For example, the method of the invention is very effective for uses such as a process which comprises printing a fine pattern through an adhesive or tacky layer on a print object, removing the adhesive or tacky layer on non-printing areas, thereafter etching according to necessity by dry or wet etching the non-printing areas of the print object which has been exposed, and then removing the set ink layer (as well as the above mentioned layers).

In order to indicate more fully the nature of the present invention, the following specific examples of practice thereof are set forth below in greater detail, it being understood that these examples are presented as illustrative only and are not intended to limit the scope of the invention.

EXAMPLE 1

On a polished copper plate of 0.15-mm thickness, patterning of a resolving power chart was carried out with a photoresist. Etching was then carried out with a ferric chloride solution to form an intaglio printing plate having a fine pattern of a depth of 3 μm. The photoresist was removed. This intaglio plate was then wrapped around and secured to a rubber roller to form an intaglio roller. An acryl-epoxy ink of the type set by ultraviolet ray radiation was applied as a coating on the printing surface of this intaglio plate. Then the ink on the non-printing areas other than the recessed parts of this intaglio plate was removed by scraping it off with a doctor blade for use in gravure printing.

Then ultraviolet rays were projected onto the intaglio plate surface to set the ink filling the recesses of the intaglio plate. After the ink had been thus set, a tacky adhesive of acrylic resin type was applied over the entire surface of the intaglio roller to form a coating film of a thickness of 1 μm.

This intaglio roller was then placed on a clean glass plate and slowly rolled thereacross. The set ink borne by the intaglio roller was thus transferred through the tacky adhesive layer onto the glass plate. As a result, the set ink within the recess of the intaglio plate was completely transferred, without any portion thereof remaining on the intaglio plate, onto the glass plate side. It was verified that a finely printed pattern area of a width of up to 30μm had thereby been printed with sharpness on the glass plate.

Thereafter this glass plate was exposed for 10 minutes to an oxygen plasma atmosphere to carry out plasma etching. By this process step, the set ink layer parts were not readily attacked by the oxygen plasma because of the presence of the benzene ring resulting from the epoxy component. On the other hand, the tacky adhesive layer parts comprising an acrylic resin were readily attacked by the oxygen plasma. As a result, the tacky adhesive layer parts of the non-printing area in which only the tacky adhesive layer was exposed were removed.

By the above described process, a printed pattern of an element width of 30 μm and a film thickness of 4 μm (3-μm ink layer +1 μm tacky adhesive layer) was sharply printed on the glass plate. Thus the resolving power chart etched on the intaglio plate was accurately and positively reproduced.

EXAMPLE 2

The intaglio printing plate used in Example 1 was chromium plated to a plating thickness of 1 μm in order to reinforce its durability relative to its doctor ring. With use of this printing plate, an intaglio roller was fabricated similarly as in Example 1. A novolak-melamine ink of thermosetting type was applied as a coating on the printing surface of this intaglio roller. Then the ink on the printing roller other than the recessed parts was scraped off with a doctor ring and thus removed.

Thereafter far-infrared rays were projected onto the intaglio plate surface to set the ink.

Separately, a print object was prepared beforehand by depositing chromium by evaporation as a plating on a glass plate and applying an acrylic tacky adhesive layer as a film of 1-μm thickness over the entire surface of the chrome plated glass plate. The above described intaglio roller was placed on the surface of this print object and rolled, whereupon the set ink on the intaglio plate surface was completely transferred onto the glass plate side. The glass plate thus printed was treated with an oxygen plasma similarly as in Example 1 thereby to remove the tacky adhesive layer parts of the non-printed area. During this oxygen plasma treatment, the set ink was not attacked because of the benzene ring due to the novolak component.

As a result of the above described process, a finely printed area of a line width of 30 μm and a film thickness of over 4 μm (ink layer 3 μm + tacky adhesive layer 1 μm) was sharply printed on the chrome plated surface of the glass plate. Thus, a fine pattern etched on the intaglio plate was accurately and positively reproduced.

EXAMPLE 3

For the printing plate, a waterless lithographic plate (produced by Toray Industries, Inc., Japan) of a plate depth of 2 μm was used. This was wrapped around a rubber roller to form a plate cylinder roller. The printing surface of this plate cylinder roller was coated with an oxidation polymerization type ink for waterless lithographic plates with an alkyd resin as its principal component. After the ink had assumed the intended pattern as a result of the mutual effect of the surface energy of the printing plate and the ink, the surface of this plate cylinder roller was irradiated with far infrared rays to set the ink. After the ink had thus set, the entire surface of the plate cylinder roller was coated with an acrylic-resin tacky adhesive to a thickness of 1 μm.

This plate cylinder roller was then rolled over a glass substrate thereby to transfer the set ink onto the glass substrate over the tacky adhesive layer. Next this glass substrate was confined for 10 minutes in an oxygen plasma atmosphere. By this treatment, the set ink parts remained since they were not attacked by the oxygen plasma because of the benzene ring due to the alkyd component. On the other hand, the tacky adhesive layer parts of the acrylic resin were readily attacked by the oxygen plasma. As a result, only the tacky adhesive layer parts not covered by the set ink were removed.

By the above described process, a fine pattern composed of printed elements of a width of 30 μm and a film thickness of 3 μm (ink layer 2 μm + tacky adhesive layer 1 μm) was reproduced by printing with good precision on the glass substrate.

EXAMPLE 4

For the printing plate, a presensitized (PS) plate of a plate depth of 2 μm was used. This was wrapped around a rubber roller to form a plate cylinder roller. Dampening water was applied by a watering roller to this plate cylinder roller, which was then coated with an ink for lithographic printing plates containing a rosin-modified phenolic resin as the principal component. As a result of the mutual effect of the surface energy of the printing plate and the water, the ink assumed the desired pattern state. Thereafter the surface of the roller was irradiated with far infrared rays to set the ink.

Next, this plate cylinder roller was rolled over a glass substrate thereby to transfer the set ink onto the glass substrate over a tacky adhesive layer. This glass substrate was then confined for 10 minutes in an oxygen plasma atmosphere. By this treatment, the set ink parts remained, not being attacked by the oxygen plasma, because of the benzene ring due to the phenol component. The tacky adhesive layer parts of the acrylic resin were readily attacked by the oxygen plasma. As a result, only the tacky adhesive layer parts not covered by the set ink were removed.

By the above described process, a fine pattern composed of printed elements of a width of 30 μm and a film thickness of 3 μm (ink layer 2 μm + tacky adhesive layer 1 μm) was reproduced by printing with good precision on the glass substrate.

EXAMPLE 5

For the printing plate, a copper intaglio printing plate (plate depth of 2 μm) with a fine pattern of recessed parts etched thereon was used. This was wrapped around a rubber roller to form a plate cylinder roller. The intaglio plate surface of this roller was coated with an acryl-urethane ink of ultraviolet ray setting type to which a thermal polymerization initiator had been added. Thereafter the ink on the printing surface of the plate other than that in the recessed parts thereof was scraped off and removed by means of a doctor blade for gravure printing use.

Next, far infrared rays were projected against the intaglio plate surface to set the ink filling the recessed parts thereof. As a result of this setting process, the surface layer parts of the ink contacting the atmospheric air retained their tackiness.

Finally, this plate cylinder roller was placed on a glass plate and slowly rolled thereon. Thus, by utilizing the above mentioned tackiness, the set ink was transferred onto the glass plate. As a result, the set ink within the plate recessed parts was completely transferred to the glass plate side without any of it remaining on the intaglio plate surface. Thus a printed pattern of a film thickness of 2 μm was reproduced with good precision.

For the above mentioned polymerization initiator, benzoylperoxide was used. However, it is possible to use also any of other peroxides, azoisobutylonitrile, and the like.

EXAMPLE 6

For the printing plate, a waterless lithographic plate (produced by Toray Industries, Inc., Japan). This plate was wrapped around a rubber roller to form a plate cylinder roller. The plate surface of this roller was coated with an acryl-epoxy ink of ultraviolet ray setting characteristic. Because of mutual effect of the surface energy of the printing plate and the ink, the ink assumed the desired pattern state. Thereafter the surface of the plate cylinder roller was irradiated with ultraviolet rays to set the ink. This setting process cause tackiness to remain in the surface layer parts of the ink in contact with the atmospheric air.

By utilizing this tackiness, the set ink was transferred from the plate cylinder roller onto a glass substrate. By the above described process, a fine pattern composed of printed elements of a width of 30 μm and a film thickness of 2 μm was printed and reproduced with good precision on the glass substrate.

EXAMPLE 7

For the printing plate, a presensitized plate of a plate depth of 2 μm was used. This plate was wrapped around a rubber roller to form a plate cylinder roller. Dampening water was applied by means of a watering roller on this plate cylinder roller. Thereafter the plate surface was coated with an ink to which the same thermal polymerization initiator as in Example 5 had been added. As a result of the mutual effect of the surface energy of the printing plate and the ink, the ink assumed the desired pattern state. Thereafter, the roller surface was irradiated with far infrared rays to set the ink. As a result of this setting process, tackiness remained in the surface layer parts of the ink contacting the atmospheric air.

This plate cylinder roller was then rolled over a glass substrate thereby to transfer the set ink onto the glass substrate. As a result of the above described process, a fine pattern composed of printing elements of 30-μm width and 2-μm thickness was printed with good precision on the glass substrate.

EXAMPLE 8

For the printing plate, an intaglio printing plate (plate depth of 2 μm) comprising a glass plate with a fine pattern of recessed parts formed by etching thereon was used. This plate was fixed on a plate slab of a flat bed, the printing surface of this intaglio plate was coated with a methanol solution of hydroquinone as a vinyl polymerization inhibitor. Then over this coating, an acryl-epoxy ink of ultraviolet ray setting type was applied as a further coating. With a doctor blade, surplus ink was scraped off from parts of the coated surface other than the recessed parts.

Then the plate printing surface was irradiated with ultraviolet rays to set the ink. The ink at its surface layer parts contacting the atmospheric air and at its surface layer parts contacting the polymerization inhibitor retained its tackiness. After the ink setting process step, the ink within the recessed parts of the intaglio plate was transferred onto a blanket by utilizing the tackiness of the ink surface layer parts contacting the atmospheric air. Successively, by utilizing the tackiness of the ink surface layer parts contacting the polymerization inhibitor, the ink on the blanket was retransferred onto a glass substrate.

By the above described process, a pattern of printed elements of an element (line) width of 30 μm and a film thickness of 2 μm was reproduced with good precision on the glass substrate.

EXAMPLE 9

For the printing plate, an intaglio similar to that described in Example 8 was used. Similarly as in Example 8, the printing surface of this plate was coated with a vinyl polymerization inhibitor. Thereafter this coating was further coated with an ink to which a thermal polymerization initiator similar to that described in Example 5 had been added. Surplus ink was removed by means of a doctor blade.

Then, by irradiation with far infrared rays, the ink was irregularly set. Thereafter, similarly as in Example 8, the ink pattern was transferred by way of a blanket onto a glass substrate. As a result, a similar fine pattern was reproduced by printing with good precision.

EXAMPLE 10

For the printing plate, a waterless lithographic plate similar to that described in Example 6 was used. This plate was fixed on a plate slab of a flat bed. Its printing surface was coated with a polymerization inhibitor similarly as in Example 8, then a similar ink was applied as an overcoating. As a consequence of the mutual effect of the surface energy of the printing plate and the ink, the ink assumed the desired pattern.

Next, ultraviolet rays were projected onto the lithographic plate surface to set the ink. The ink retained tackiness in its surface layer parts containing the atmospheric air and its surface layer parts contacting the polymerization inhibitor. After the setting step, the tackiness of the ink surface layer parts contacting the atmospheric air was utilized to transfer the ink in the recessed parts of the plate was transferred onto a blanket. Successively, by utilizing the ink tackiness of its surface layer parts contacting the polymerization inhibitor, the ink on the blanket was retransferred onto a glass substrate.

As a result, a fine printed pattern of a printing element (line) width of 30 μm and an ink film thickness of 2 μm was reproduced with good precision on the glass substrate.

EXAMPLE 11

For the printing plate, a PS plate similar to that described in Example 7 was used. This plate was fixed on a plate slab of a flat bed. Similarly as in Example 8, a polymerization inhibitor was applied as a coating on the plate printing surface. Then an ink to which a thermal polymerization initiator had been added similarly as in Example 7 was applied as a coating.

Upon completion of the patterning of the ink on the printing plate, the plate surface was irradiated with far infrared rays to set the ink. After this setting treatment, the ink within the printing plate was transferred onto a blanket by utilizing the tackiness of the ink surface layer parts contacting the atmospheric air. Successively, by utilizing the tackiness of the ink surface layer parts contacting the polymerization inhibitor, the ink on the blanket was retransferred onto a glass substrate.

As a result, a fine printed pattern of a print element (line) width of 30 μm and a film thickness of 2 μm was reproduced with good precision on the glass substrate.

EXAMPLE 12

For the printing plate, a waterless lithographic plate (produced by Toray Industries, Inc.) of a plate depth of 2 μm was used. This plate was fixed on a plate slab of a flat bed. The printing surface of this plate was coated with an acryl-epoxy ink of ultraviolet ray setting type. As a result of the mutual effect of the surface energy of the plate and the ink, the ink assumed the desired pattern. Thereafter ultraviolet rays were projected thereby to set the ink on the plate.

Then, by utilizing the tackiness of the ink surface layer parts contacting the atmospheric air, the ink within the printing plate was transferred onto a blanket. Successively, the ink on the blanket was retransferred by way of an acrylic resin tacky adhesive layer onto a glass substrate which had been coated over its entire surface with the acrylic resin tacky adhesive layer of a thickness of 1 μm.

Next, this glass substrate was confined in and exposed to an oxygen plasma atmosphere for 10 minutes to carry out plasma etching. During this process step, the set ink layer parts were not readily attacked by the oxygen plasma because of the pressure of the benzene ring resulting from the epoxy component. On the other hand, the tacky adhesive layer parts comprising an acrylic resin were readily attacked by the oxygen plasma. As a result, the tacky adhesive layer parts of the non-printing area in which only the tacky adhesive layer was exposed were removed.

By the above described process, a printed pattern of an element width of 30 μm and a film thickness of 3 μm (ink layer 2 μm + tacky layer 1 μm) was reproduced with good precision on the glass substrate.

EXAMPLE 13

For the printing plate, an intaglio printing plate (plate depth of 2 μm) comprising a glass plate on the surface of which a fine pattern of recessed parts had been etched was used. This plate was fixed on a plate slab of a flat bed. The printing surface of this intaglio plate was coated with an acryl-epoxy ink of ultraviolet ray setting type. Surplus ink on parts other than the recessed parts of the plate was scraped off and removed with a doctor blade.

Next, ultraviolet rays were projected onto the reverse side of the intaglio plate to set the ink. As a consequence of this ink setting treatment applied from the plate back side, the front surface side of the ink, that is, the surface layer parts contacting the atmospheric air retained good tackiness.

By utilizing this tackiness, the ink within the intaglio plate was transferred onto a blanket. Successively, onto a glass substrate coated over its entire surface to a thickness of 1 μm with an acrylic resin tacky adhesive, the ink on the blanket was retransferred over the intervening tacky adhesive layer.

Next, this glass substrate was confined in and exposed to an oxygen atmosphere for 10 minutes to carry out plasma etching. During this process, the set ink layer parts were not readily attacked by the oxygen plasma because of the presence of the benzene ring resulting from the epoxy component. On the other hand, the tacky adhesive layer parts comprising an acrylic resin were readily attacked by the oxygen plasma. As a result, the tacky adhesive layer parts of the non-printing area in which only the tacky adhesive layer was exposed were removed.

By the above described process, a printed pattern of an element width of 30 μm and a film thickness of 3 μm (ink layer of 2 μm + tacky layer 1 μm) was reproduced with good precision on the glass substrate.

As described in the foregoing disclosure, the present invention provides a printing method characterized by the following features. In this method an intaglio or lithographic printing plate is used and is processed for printing by imparting thereon a printing elements delineating a fine pattern of very narrow ink elements of a desired film thickness. The setting type ink thus patterned is set in the recessed parts or on the plate surface. Thereafter ink thus set is transferred onto a print object.

Thus, by the practice of the printing method of this invention, printing of patterns of very narrow printing elements (lines) of less than 100-μm width with the desired ink film thickness can be easily carried out. This is a definite improvement over the prior printing techniques by which printing elements of minimum widths of only 100 to 200 μm could be reproduced by printing. Moreover, the patterned setting type ink is transferred at the stage where it has been set on the printing plate and has assumed a fully non-fluid state, onto the print object. For this reason, there is no possibility of the printed image form being distorted at the time of the transferring or after the transferring. Thus, the fine pattern is sharply reproduced by printing in a state wherein the image form patterned on the printing plate is faithfully maintained.

Furthermore, because of the above described features of process of the present invention, the forming of fine printed patterns, which heretofore could be produced only by relying on the high cost and inefficient photoresist-method, can be accomplished efficiently and moreover at low cost by the method of this invention. A further feature of the method of the invention is that, by carrying out printing by way of an adhesive or tacky layer, a setting type ink can be transferred stably and moreover simply also onto print objects such as those possessing hardness and rigidity.

Still another feature of the invention is that, in some cases, the ink is so set that at least one part of the ink surface layer parts is left in an incompletely set state thereby to carry out partially local setting. In such a case, at the parts where the ink has completely set, with an image form which is true to the form patterned on the printing plate maintained as it is, the fine pattern can be sharply reproduced by printing. At the same time, by utilizing the tackiness at the ink surface layer parts in an incompletely set state, the transfer of the set onto the print object is facilitated and can be made positive. Thus, printing of good reproducibility can be carried out efficiently.

Therefore the printing method of the present invention is broadly applicable to various uses for forming fine patterns. A few examples of such applications are glass photomasks and fine printed circuit chips. By the method of this invention, all of these applications can be carried out with high precision yet at low cost.

What is claimed is:

1. A method of printing a pattern on a print object, sequentially comprising the steps of:
    providing a printing plate having a printing surface with an original pattern formed thereon;
    applying to the printing surface of said printing plate setting ink which undergoes an irreversible chemical reaction causing hardening thereof when subjected to a physical treatment, said setting ink assuming the pattern formed on said printing plate;
    subjecting said pattern of ink to said physical treatment while on said printing plate to thereby cause said irreversible chemical reaction and harden a portion of said pattern of ink other than an outer surface part thereof, such that said hardened portion of said pattern of ink is sufficient to maintain an overall shape of said pattern of ink; and
    contacting said printing surface of said printing plate to a print object to thereby transfer said pattern of ink onto said print object, whereby said hardened portion of said pattern of ink maintains said overall shape of said pattern of ink during and after transfer from said printing plate to said print object.

2. The method of claim 1, wherein said pattern includes a plurality of printed elements each having a minimum width of less than 100 μm.

3. The method of claim 1, further comprising the steps of:
    providing an intaglio printing plate as said printing plate, wherein a printing surface thereof has recessed parts delineating said pattern;
    applying a coating of said setting ink over the printing surface; and
    removing said setting ink from parts of said printing surface other than said recessed parts by means of a doctor blade, thereby leaving in tact the ink filling said recessed parts to form said pattern on said printing surface.

4. The method of claim 1, further comprising the steps of:
    providing a lithographic printing plate as said printing plate; and
    causing said setting ink to adhere only to parts of said printing surface which are to bear and delineate said pattern.

5. The method of claim 1, further comprising the steps of:
    providing an adhesive layer on said print object; and
    transferring said pattern, which has been subjected to said physical treatment, onto said print object with said adhesive layer interposed between said pattern and said print object.

6. The method of claim 5, further comprising the step of:
    removing said adhesive layer existing on parts of said print object where said pattern does not exist, after the step of transferring said pattern.

7. The method of claim 1, further comprising the steps of:
    providing an adhesive layer on said printing surface after said pattern has been applied to the printing surface; and
    transferring treatment onto said print object with said layer interposed between said pattern and said print object.

8. The method of claim 7, further comprising the step of:
    removing said adhesive layer existing on parts of said print object where said pattern does not exist, after the step of transferring said pattern.

9. The method of claim 1, wherein said physical treatment consists of a radiation of the setting ink with radiation rays.

10. The method of claim 9, wherein said radiation is ionizing radiation.

11. The method of claim 9, wherein said radiation is ultraviolet radiation.

12. The method of claim 9, wherein said radiation is infrared radiation.

13. The method of claim 9, wherein said radiation is electron-ray radiation.

14. The method of claim 1, wherein said outer surface of said pattern, after being subjected to said physical treatment, is incompletely hardened and thus retains tackiness.

15. The method of claim 14, further comprising the steps of:
    transferring said pattern, which has been subjected to said physical treatment, onto an intermediate structure; and
    then transferring said pattern from said intermediate structure onto said print object.

16. The method of claim 15, further comprising the step of:
    interposing an adhesive layer between said intermediate structure and said print object before transferring said pattern from said intermediate structure to said print object.

17. The method of claim 15, wherein said physical treatment consists of irradiation of said setting ink with radiation rays from a surface of said printing plate which is opposite said printing surface of said printing plate.

18. The method of claim 1, wherein said ink comprises, as a principal component, a resin which has an acryl radical or a methacryl radical, and said ink hardens by vinyl polymerization, wherein said outer surface part of said pattern which is exposed to atmospheric air is incompletely hardened after being subjected to said physical treatment and thus retains tackiness.

19. A method of printing a pattern on a print object, sequentially comprising the steps of:
    coating a printing surface of a printing plate with a vinyl polymerization inhibitor;

applying to said printing surface a pattern of setting ink which undergoes an irreversible chemical reaction causing hardening thereof when subjected to a physical treatment, said setting ink comprising, as a principal component, a resin which has an acryl radical or a methacryl radical, and said setting ink hardens by vinyl polymerization;

subjecting said pattern to said physical treatment to thereby cause said irreversible chemical reaction and harden a portion of said pattern other than an outer surface part thereof such that said hardened portion of said pattern is sufficient to maintain an overall shape of said pattern; and contacting said printing surface of said printing plate to a print object to thereby transfer said pattern to said print object, whereby said hardened portion of said pattern maintains said overall shape of said pattern during and after the transfer from said printing plate to said print object;

wherein said outer surface part of said ink pattern which is exposed to atmospheric air while on said printing plate, after being subjected to said physical treatment, is incompletely hardened and thus retains tackiness.

* * * * *